United States Patent
Hong

(10) Patent No.: US 9,120,126 B2
(45) Date of Patent: Sep. 1, 2015

(54) ELECTRO-ACOUSTIC TRANSDUCER AND METHOD OF MANUFACTURING THE SAME

(75) Inventor: Seog-woo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 756 days.

(21) Appl. No.: 13/401,324

(22) Filed: Feb. 21, 2012

(65) Prior Publication Data

US 2013/0051179 A1  Feb. 28, 2013

(30) Foreign Application Priority Data

Aug. 23, 2011  (KR) .................. 10-2011-0084058

(51) Int. Cl.
| | | |
|---|---|---|
| H01L 41/00 | (2013.01) | |
| B06B 1/02 | (2006.01) | |
| H01L 41/047 | (2006.01) | |
| H01L 23/48 | (2006.01) | |
| H01L 23/00 | (2006.01) | |

(52) U.S. Cl.
CPC ............... *B06B 1/02* (2013.01); *H01L 23/481* (2013.01); *H01L 41/047* (2013.01); *B32B 2457/14* (2013.01); *H01L 24/81* (2013.01); *H01L 2224/16145* (2013.01); *H01L 2224/81805* (2013.01); *H01L 2924/01322* (2013.01); *Y10T 156/1056* (2015.01)

(58) Field of Classification Search
CPC .. B06B 1/02; H01L 41/047; H01L 224/81805
See application file for complete search history.

(56) References Cited

U.S. PATENT DOCUMENTS

| | | | | |
|---|---|---|---|---|
| 7,846,102 | B2 * | 12/2010 | Kupnik et al. | 600/459 |
| 7,981,765 | B2 * | 7/2011 | Martin et al. | 438/455 |
| 2002/0066952 | A1 * | 6/2002 | Taniguchi et al. | 257/698 |
| 2005/0121734 | A1 * | 6/2005 | Degertekin et al. | 257/414 |
| 2007/0200222 | A1 * | 8/2007 | Ehmke et al. | 257/704 |
| 2009/0152980 | A1 * | 6/2009 | Huang | 310/309 |
| 2010/0123369 | A1 * | 5/2010 | Ono et al. | 310/348 |
| 2011/0169510 | A1 * | 7/2011 | Kandori et al. | 324/686 |
| 2011/0182149 | A1 * | 7/2011 | Kandori et al. | 367/189 |
| 2011/0215429 | A1 * | 9/2011 | Yoshida | 257/415 |
| 2011/0233694 | A1 * | 9/2011 | Yoshida | 257/418 |

FOREIGN PATENT DOCUMENTS

| | | |
|---|---|---|
| JP | 2009-165931 A | 7/2009 |
| JP | 2010-114165 A | 5/2010 |
| JP | 2010-186830 A | 8/2010 |
| KR | 10-0781467 B1 | 11/2007 |

* cited by examiner

*Primary Examiner* — Isam Alsomiri
*Assistant Examiner* — Hovhannes Baghdasaryan
(74) *Attorney, Agent, or Firm* — Sughrue Mion, PLLC

(57) ABSTRACT

Electro-acoustic transducers and methods of manufacturing the electro-acoustic transducer are provided. An electro-acoustic transducer includes: a first wafer including a first substrate in which a plurality of electro-acoustic transducer cells are formed; and a second wafer disposed in a lower portion of the first wafer, and including a second substrate in which a plurality of through wafer vias are formed. A method of manufacturing an electro-acoustic transducer includes: forming a plurality of electro-acoustic transducer cells in a first substrate of a first wafer; forming a plurality of through wafer vias in a second substrate of a second wafer; and bonding the first and second wafers to each other.

13 Claims, 13 Drawing Sheets

ELECTRO-ACOUSTIC TRANSDUCER AND METHOD OF MANUFACTURING THE SAME

CROSS-REFERENCE TO RELATED APPLICATION

This application claims priority from Korean Patent Application No. 10-2011-0084058, filed on Aug. 23, 2011 in the Korean Intellectual Property Office, the disclosure of which is incorporated herein in its entirety by reference.

BACKGROUND

1. Field

Methods and apparatuses consistent with the present disclosure relate to electro-acoustic transducers and methods of manufacturing the same, and more particularly, to an electro-acoustic transducer including a through wafer via to facilitate an electrical connection of the electro-acoustic transducer and a circuit substrate, and a method of manufacturing the same.

2. Description of the Related Art

Micromachined electro-acoustic transducers (hereinafter referred to as "electro-acoustic transducers") may transform electrical signals into acoustic signals or transform acoustic signals into electrical signals. Among theses, micromachined ultrasonic transducers (MUTs), hereinafter referred to as "ultrasonic transducers", may transform electrical signals into ultrasonic signals or transform ultrasonic signals into electrical signals. Ultrasonic transducers are used in, for example, medical imaging diagnosis apparatuses and are useful for non-invasively taking photos or images of tissues or organisms of the human body. Also, the ultrasonic transducers may include a piezoelectric micromachined ultrasonic transducer (pMUT), a capacitive micromachined ultrasonic transducer (cMUT), and a magnetic micromachined ultrasonic transducer (mMUT) according to a transformation method.

SUMMARY

According to an aspect of an embodiment, there is provided an electro-acoustic transducer including: a first wafer including a first substrate in which a plurality of electro-acoustic transducer cells are formed; and a second wafer disposed in a lower portion of the first wafer, and including a second substrate in which a plurality of through wafer vias are formed.

The first and second wafers may be bonded onto each other by eutectic bonding.

The first wafer may include: a support unit disposed on the first substrate and in which a plurality of through holes are formed; a first insulating layer disposed in bottom surfaces of the plurality of through holes; and a thin film disposed on the support unit.

The electro-acoustic transducer may further include: an electrode layer disposed on the thin film.

The electro-acoustic transducer may further include: a first via formed passing through the first substrate and the support unit.

The first via may include: a second via formed passing through the first substrate positioned in a lower portion of the support unit; and a third via formed passing through the support unit and connected to the second via.

The electro-acoustic transducer may further include: a first electrode pad disposed in the first via and a lower surface of the first substrate; and a second electrode pad disposed in the lower surface of the first substrate and spaced apart from the first electrode pad.

The electro-acoustic transducer may further include: a second insulating layer disposed in an inner wall of the first via and the lower surface of the first substrate, and insulating the first substrate from the first electrode pad.

The electrode layer may be electrically connected to a first electrode pad disposed in a first via formed passing through the first substrate and the support unit through a fourth via formed in the thin film.

The plurality of through wafer vias may include: a first through wafer via filled with a first conductive material electrically connected to the first electrode pad; and a second through wafer via filled with a second conductive material electrically connected to the second electrode pad.

The electro-acoustic transducer may further include: a plurality of electrode pads disposed in top and bottom surfaces of the first and second through wafer vias.

The electro-acoustic transducer may further include: a third electrode pad disposed on a top surface of the second substrate, and electrically connected to the first conductive material filled in the first through wafer via; and a fourth electrode pad disposed on the top surface of the second substrate, and electrically connected to the second conductive material filled in the second through wafer via.

The first electrode pad may be connected to the third electrode pad by eutectic bonding, and the second electrode pad is connected to the fourth electrode pad by eutectic bonding.

According to an aspect of another embodiment, there is provided a method of manufacturing an electro-acoustic transducer, the method including: forming a plurality of electro-acoustic transducer cells in a first substrate of a first wafer; forming a plurality of through wafer vias in a second substrate of a second wafer; and bonding the first and second wafers.

The first and second wafers may be bonded onto each other by eutectic bonding.

The forming of the plurality of electro-acoustic transducer cells may include: forming a support unit in which a plurality of through holes are formed on the first substrate; forming a first insulating layer disposed in bottom surfaces of the plurality of through holes; and forming a thin film on the support unit.

The support unit may be formed by oxidizing a part of the first substrate.

The forming of the thin film may include: attaching a silicon on insulator (SOI) wafer including a device wafer, an insulating layer, and a handle wafer onto the support unit; and removing the insulating layer and the handle wafer, and leaving the device wafer on the support unit.

The method may further include: forming a first via to pass through the first substrate and the support unit; forming a first electrode pad in the first via and a lower surface of the first substrate; and forming a second electrode pad in the lower surface of the first substrate in such a way that the second electrode pad is spaced apart from the first electrode pad.

The forming of the first via may include: forming a second via to pass through the first substrate disposed in a lower portion of the support unit; and forming a third via to pass through the support unit and connect the second via.

The method may further include: forming a fourth via in the thin film to expose the first electrode pad; and forming an electrode layer on the thin film, and electrically connecting the electrode layer and the first electrode pad through the fourth via.

The method may further include: forming a second insulating layer that insulates the first substrate from the first electrode pad in an inner wall of the first via and the lower surface of the first substrate.

The method may further include: forming first and second through wafer vias spaced apart from each other in the second substrate; filling the first and second through wafer vias with first and second conductive materials; and forming a third electrode pad connected to the first conductive material filled in the first through wafer via and a fourth electrode pad connected to the second conductive material filled in the second through wafer via.

The first electrode pad may be connected to the third electrode pad by eutectic bonding, and the second electrode pad is connected to the fourth electrode pad by eutectic bonding.

The method may further include: forming a third insulating layer in upper and lower surfaces of the second substrate and inner walls of the first and second through wafer vias.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
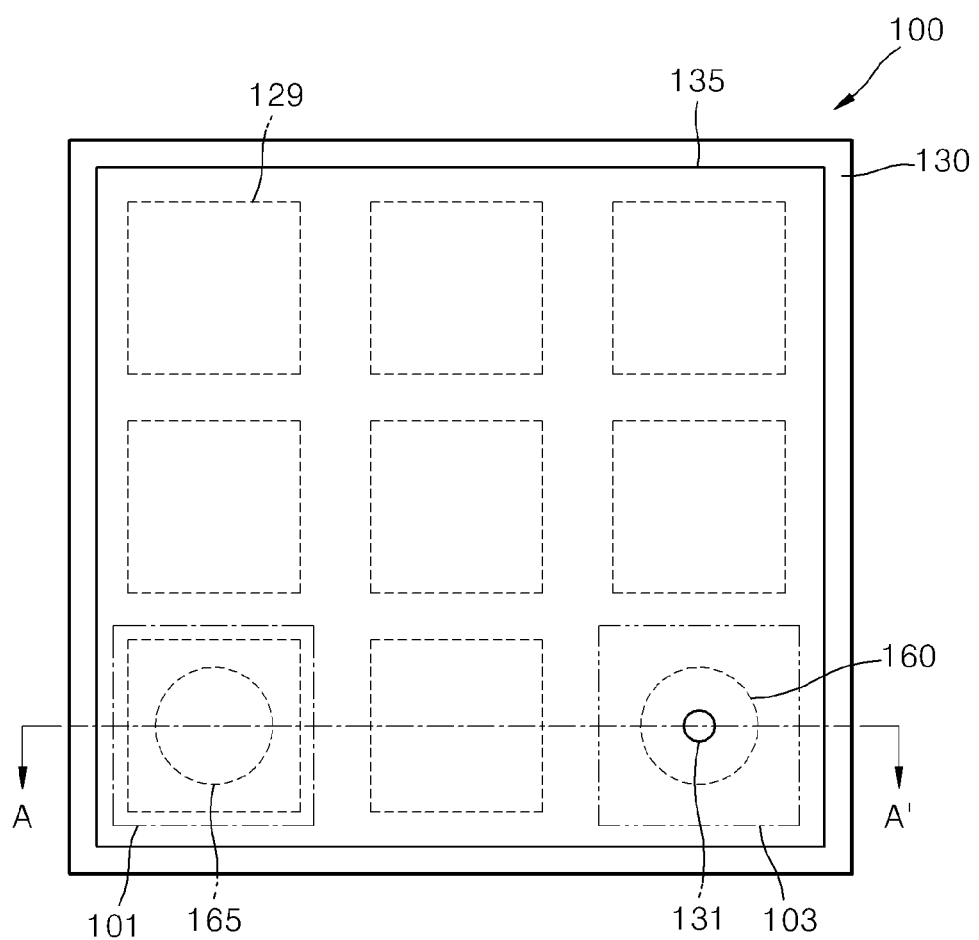
FIG. 1A is a schematic plan view of an electro-acoustic transducer according to an embodiment.

Various exemplary embodiments will now be described more fully with reference to the accompanying drawings in which some exemplary embodiments are shown.

Detailed illustrative exemplary embodiments are disclosed herein. However, specific structural and functional details disclosed herein are merely representative for purposes of describing exemplary embodiments. The inventive concept may, however, may be embodied in many alternate forms and should not be construed as limited to only the exemplary embodiments set forth herein.

Accordingly, while exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments may to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to limit exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions and sizes of elements may be exaggerated for clarity and convenience. Like reference numerals in the drawings denote like elements.

Expressions such as "at least one of," when preceding a list of elements, modify the entire list of elements and do not modify the individual elements of the list.

Figure 1B:
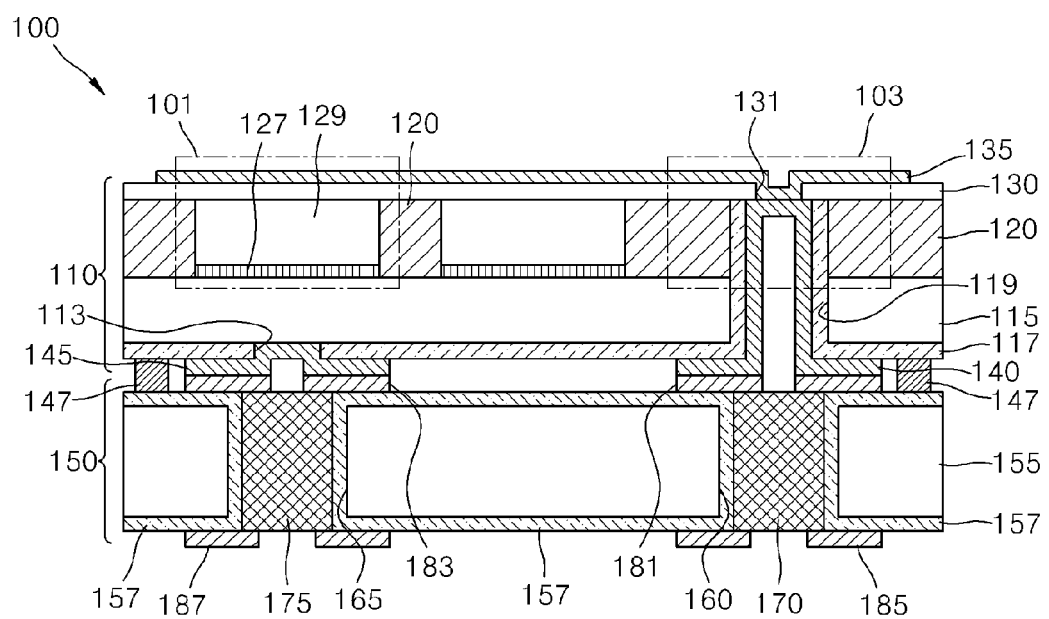
FIG. 1B is a schematic cross-sectional view of an electro-acoustic transducer taken from a line AA' of FIG. 1A.

FIG. 1A is a schematic plan view of an electro-acoustic transducer 100 according to an embodiment. FIG. 1B is a schematic cross-sectional view of the electro-acoustic transducer 100 taken from a line AA' of FIG. 1A.

Referring to FIGS. 1A and 1B, the electro-acoustic transducer 100 may include a first wafer 110 and a second wafer 150 that are bonded together. In this regard, the first wafer 110 and the second wafer 150 may be bonded to each other by eutectic bonding, although other various bonding methods may be utilized.

The first wafer 110 may include a plurality of electro-acoustic transducer cells 101 and at least one via forming unit 103. The electro-acoustic transducer cells 101 and the via forming unit 103 may be arranged in an m×n two-dimensional (2D) array on a top surface of a first substrate 115, where m and n are natural numbers. For example, although eight electro-acoustic transducer cells 101 and one via forming unit 103 are arranged in a 3×3 2D array in FIG. 1A, the inventive concept is not limited thereto, and the number and arrangement of the electro-acoustic transducer cells 101 and the via forming unit 103 may be modified in various ways.

Each of the electro-acoustic transducer cells 101 include the first substrate 115, a support unit 120 disposed on the first substrate 115 and in which a plurality of through holes are formed, a thin film 130 disposed on the support unit 120, and an electrode layer 135 disposed on the thin film 130. In this regard, the through holes formed in the support unit 120 are sealed by the first substrate 115 and the thin film 130 so that a cavity 129 is formed. The inside of the cavity 129 may be in a vacuum. A first insulating layer 127 may be disposed on the first substrate 115 that forms a bottom surface of the cavity 129.

The first substrate 115 may be formed of silicon, and have a thickness of several tens of μm. For example, the thickness of the first substrate 115 may be from about 10 μm to about 90 μm, and more particularly from about 10 μm to about 50 μm. The first substrate 115 may be formed of highly doped silicon, i.e., low resistance silicon, and may be used as a lower electrode. The support unit 120 may be formed of an insulator. The support unit 120 may include, for example, oxide, nitride, etc., and more particularly, silicon oxide. For example, the support unit 120 may be formed by patterning silicon oxide on the first substrate 115. The thin film 130 may be disposed on and supported by the support unit 120. The first insulating layer 127 may include, for example, oxide, nitride, etc., and more particularly, silicon oxide. The first insulating layer 127 may prevent a short circuit between the first substrate 115 that is a lower electrode and the electrode layer 135 that is an upper electrode.

Operations of the electro-acoustic transducer cells 101 will now be described. First, a principle of transmitting an acoustic signal in the electro-acoustic transducer cells 101 is as follows. If a direct current (DC) voltage (not shown) is applied to the first substrate 115 that is the lower electrode and the electrode layer 135 that is the upper electrode, the thin film 130 may be positioned at a height in which an electrostatic force between the first substrate 115 and the electrode layer 135 and a gravity applied to the thin film 130 are parallel to each other. When the DC voltage (not shown) is applied to the first substrate 115 and the electrode layer 135, if an alternating current (AC) voltage is applied to the first substrate 115 and the electrode layer 135, the thin film 130 may vibrate due to a change in the electrostatic force between the first substrate 115 and the electrode layer 135. Such vibration may result in a transmission of an acoustic signal from the thin film 130. For example, the electro-acoustic transducer cells 101 may transmit ultrasonic waves.

Next, a principle of receiving an acoustic signal in the electro-acoustic transducer cells 101 will be described. Similar to the transmission of the acoustic signal, if a DC voltage (not shown) is applied to the first substrate 115 and the electrode layer 135, the thin film 130 may be positioned at a height in which an electrostatic force between the first substrate 115 and the electrode layer 135 and a gravity applied to the thin film 130 are parallel to each other. When the DC voltage (not shown) is applied to the first substrate 115 and the electrode layer 135, if an external physical signal, for example, the acoustic signal, is applied to the first substrate 115 and the electrode layer 135, the electrostatic force between the first substrate 115 and the electrode layer 135 may change. An acoustic signal may be received from an external source by sensing the change in the electrostatic force. For example, the electro-acoustic transducer cells 101 may receive ultrasonic waves.

The via forming unit 103 may include the first substrate 115 in which a first via 119 is formed, the support unit 120, the thin film 130 disposed on the support unit 120 and in which a fourth via 131 connected to the first via 119 is formed, a first electrode pad 140 disposed inside the first via 119, and the electrode layer 135 disposed on the thin film 130 and connected to the first electrode pad 140 through the fourth via 131. The first via 119 may be formed in the first substrate 115 and the support unit 120 which are sequentially formed. The first electrode pad 140 may be formed in an inner wall and an upper portion of the first via 119. The first electrode pad 140 may extend to the lower surface of the first substrate 115. A second insulating layer 117 may be further disposed in the inner wall of the first via 119 and the lower surface of the first substrate 115 to insulate the first substrate 115 from the first electrode pad 140. The fourth via 131 connected to the first via 119 may be formed in the thin film 130. The electrode layer 135 may be formed on the thin film 130 in which the fourth via 131 is formed. Thus, the electrode layer 135 may be electrically connected to the first electrode pad 140 through the fourth via 131.

A second electrode pad 145 may be disposed on the lower surface of the first substrate 115 and may be spaced apart from the first electrode pad 140. The second electrode pad 145 may be electrically connected to the first substrate 115 that may be used as a lower electrode. If the second insulating layer 117 is further formed on the lower surface of the first substrate 115, the second insulating layer 117 may be patterned 113 to expose the first substrate 115, and the second electrode pad 145 may be partially disposed on the exposed first substrate 115 and the patterns second insulating layer 117.

The first and second electrode pads 140 and 145 may be formed of a eutectic bonding metal, for example, Au, Cu, Sn, Ag, Al, Pt, Ti, Ni, Cr, or an alloy of these metals. The electrode layer 135 may be formed of a conductive material, for example, Au, Cu, Sn, Ag, Al, Pt, Ti, Ni, Cr, or an alloy of these metals. The second insulating layer 117 may be formed of oxide or nitride, for example, silicon oxide or silicon nitride. The first via 119 may be filled with a conductive material, for example, Au, Cu, Sn, Ag, Al, Pt, Ti, Ni, Cr, or an alloy of these metals.

The second wafer 150 may be disposed in a lower portion of the first wafer 110. The second wafer 150 may be bonded onto the first wafer 110 by eutectic bonding. The second wafer 150 may include a second substrate 155 in which a plurality of through wafer vias are formed. For example, a first through wafer via 160 corresponding to the via forming unit 103 may be formed in the second substrate 155, and a second through wafer via 165 corresponding to the electro-acoustic transducer cells 101 may be formed. First and second conductive materials 170 and 175 may be filled in the insides of the first and second through wafer via 160 and 165. A third electrode pad 181 may be formed on a top surface of the second substrate 155 in which the first through wafer via 160 is formed and may contact the first conductive material 170. The third electrode pad 181 may be electrically connected to the first electrode pad 140 positioned on a top portion thereof. A fourth electrode pad 183 may be formed on a top surface of the second substrate 155 in which the second through wafer via 165 is formed and may contact the second conductive material 175. The fourth electrode pad 183 may be electrically connected to the second electrode pad 145 positioned on a top portion thereof.

A fifth electrode pad 185 may be formed on a lower surface of the second substrate 155 in which the first through wafer via 160 is formed and may contact the first conductive material 170. A sixth electrode pad 187 may be formed on a lower surface of the second substrate 155 in which the second through wafer via 165 is formed and may contact the second conductive material 175. The fifth and sixth electrode pads 185 and 187 may be electrically connected to a printed circuit board (PCB) or an application-specific integrated circuit (ASIC) (not shown) disposed in the lower portion of the second substrate 155.

The third insulating layer 157 may be further disposed on the top and bottom surfaces of the second substrate 155 and in the inner walls of the first and second through wafer vias 160 and 165. The third insulating layer 157 may be formed of silicon oxide or silicon nitride, for example, silicon oxide or silicon nitride. For example, the third insulating layer 157 may be formed by depositing tetraethyl orthosilicate (TEOS) onto the second wafer 150 at a high temperature from about 400° C. to about 900° C.

The second substrate 155 may be formed of silicon, etc. That is, the second substrate 155 may be a silicon substrate and the first and second through wafer vias 160 and 165 may be silicon through vias (TSVs). The third through sixth electrode pads 181, 183, 185, and 187 may be formed of eutectic bonding metals, for example, Au, Cu, Sn, Ag, Al, Pt, Ti, Ni, Cr, or an alloy of these metals. The first and second conductive materials 170 and 175 may include, for example, Au, Cu, Sn, Ag, Al, Pt, Ti, Ni, Cr, or an alloy of these metals.

A seal line 147 may be respectively disposed near a boundary of the lower surface of the first substrate 115 and a boundary of the upper surface of the second substrate 155. The seal line 147 may surround the first through fourth electrode pads 140, 145, 181, and 183 to protect electrical connection units such as the first through fourth electrode pads 140, 145, 181, and 183 from an external environment. The seal lines 147 formed on the first and second wafers 110 and 150 may be used to connect the first and second wafers 110 and 150 by eutectic bonding. Thus, the seal lines 147 may further strengthen coupling between the first and second wafers 110 and 150. The seal lines 147 may be formed of a metal, for example, Au, Cu, Sn, Ag, Al, Pt, Ti, Ni, Cr, or an alloy of these metals.

The first and second wafers 110 and 150 may be mechanically and electrically connected by eutectic bonding. Eutectic bonding is a method of bonding metals by thermally compressing the metals to a eutectic temperature, hardening the metals below the eutectic temperature, and forming a bonding layer, which is one of high strength and stable bonding methods. For example, the first electrode pad 140 may be bonded to the third electrode pad 181 by eutectic bonding, and the second electrode pad 145 may be bonded to the fourth electrode pad 183 by eutectic bonding. The electro-acoustic transducer 100 may include the first and second wafers 110 and 150 that are bonded onto each other, and may electrically connect the first wafer 110 in which the electro-acoustic transducer cells 101 are formed to an external substrate through the second wafer 150. The second wafer 150 of the electro-acoustic transducer 100 may be used as a handle wafer. That is, the second wafer 150 of several hundreds of μm may be a support substrate to carry or process the electro-acoustic transducer cells 101 formed in the first wafer 110.

If a via is formed on a wafer including a thick silicon layer and an oxide layer through a deep reactive ion etching (DRIE) process, a problem such as a notch or scallop may occur at an interface where silicon and oxide bond with each other. Although the via is formed, a via has a high aspect ratio (HAR) structure, which makes it difficult to perform metal patterning. Thus, it is difficult to form an electrode pad in the via, and an electrical connection between the via and the electrode pad may have a low reliability. If the via is formed in the first wafer 110, a size of the via is limited since the via forming unit 103 is formed in the support unit 120 filled with an insulator, instead of at least one of the electro-acoustic transducer cells 101. Thus, the via formed in the via forming unit 103 may not be greater than those of the electro-acoustic transducer cells 101.

However, since the second wafer 150 of the electro-acoustic transducer 100 includes silicon except oxide, the first and second through wafer vias 160 and 165 may be easily formed. The first and second through wafer vias 160 and 165 may be formed irrespective of sizes thereof, and may be greater than those of the electro-acoustic transducer cells 101. The first wafer 110 is thinned and thus the first via 119 may not have the HAR structure. Thus, the first electrode pad 140 may be easily formed in the first via 119, thereby increasing a reliability of an electrical connection between the first electrode pad 140 and the first via 119.

Figure 2:
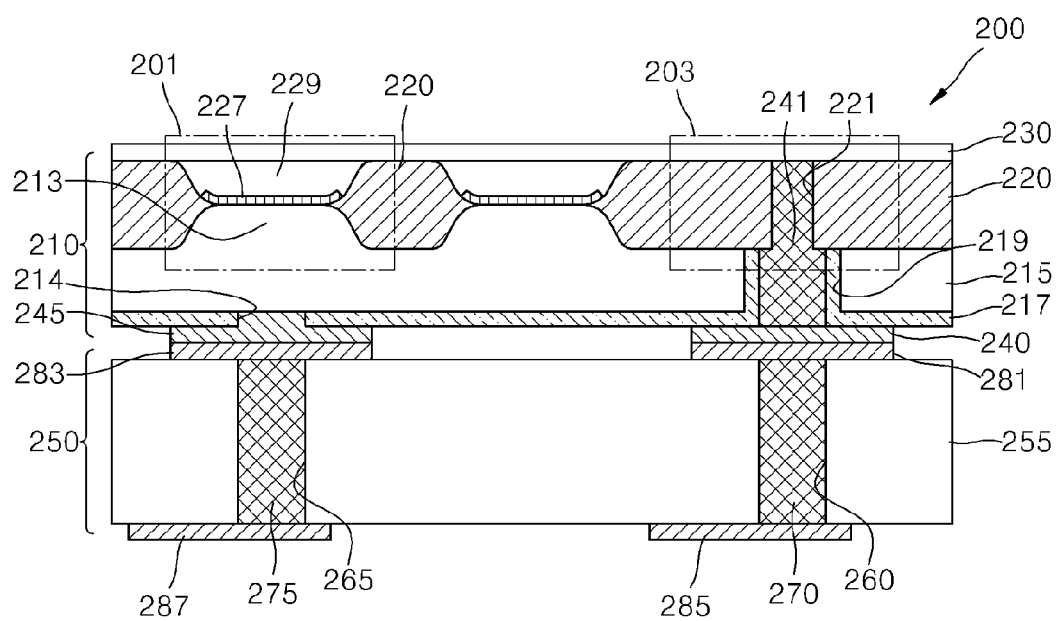
FIG. 2 is a schematic plan view of an electro-acoustic transducer according to another embodiment.

FIG. 2 is a schematic plan view of an electro-acoustic transducer 200 according to another embodiment.

Referring to FIG. 2, the electro-acoustic transducer 200 may include a first wafer 210 and a second wafer 250 that are bonded together. In this regard, the first and second wafers 210 and 250 may be bonded onto each other by eutectic bonding.

The first wafer 210 may include a plurality of electro-acoustic transducer cells 201 and at least one via forming unit 203. The electro-acoustic transducer cells 201 and the via forming unit 203 may be arranged in an m×n 2D array on a top surface of a first substrate 215, where m and n are natural numbers. Each of the electro-acoustic transducer cells 201 may include the first substrate 215, a support unit 220 disposed on the first substrate 215 and in which a plurality of trenches are formed, and a thin film 230 disposed on the support unit 220. In this regard, the trenches formed in the support unit 220 are sealed by the first substrate 215 and the thin film 230 so that a cavity 229 is formed. The inside of the cavity 229 may be in a vacuum. A first insulating layer 227 may be disposed on the first substrate 215 that forms a bottom surface of the cavity 229.

The first substrate 215 may be formed of silicon, and have a thickness of several tens of μm. For example, the thickness of the first substrate 215 may be from about 10 μm to about 90 μm, and more particularly from about 10 μm to about 50 μm. The first substrate 215 may be formed of highly doped silicon, i.e. low resistance silicon, and may be used as a lower electrode. The support unit 220 may be formed of an insulator. The support unit 220 may include, for example, oxide, nitride, etc., and more particularly, silicon oxide. For example, the support unit 220 may be formed by using a local oxidation of silicon (LOCOS) process of locally oxidizing the first substrate 215 formed of silicon. The thin film 230 may be disposed on and supported by the support unit 220. The thin film 230 may be formed of highly doped silicon, i.e. low resistance silicon, and may be used as an upper electrode. The first insulating layer 227 may include, for example, oxide, nitride, etc., and more particularly, silicon oxide. The first insulating layer 227 may prevent a short circuit between the first substrate 215 that is a lower electrode and the thin film 230 that is an upper electrode. A protrusion unit 213 may be formed on the first substrate 215 by using a silicon oxidation process. A height of the protrusion unit 213 may be used to adjust a gap between the upper and lower electrodes.

An operation principle, i.e., a transmission and receiving principle, of the electro-acoustic transducer cells 201 is as follows. However, in the electro-acoustic transducer cells 201, the first substrate 215 may be used as a lower electrode, and the thin film 230 may be used as an upper electrode. That is, a DC voltage (not shown) or an AC voltage may be applied to the first substrate 215 and the thin film 230.

The via forming unit 203 may include the first substrate 215 in which a second via 219 is formed, the support unit 120 in which a third via 221 is formed, the thin film 230 disposed on the support unit 220, a conductive material 241 filled inside of the second and third vias 219 and 221, and a first electrode pad 240 disposed in a lower surface of the first substrate 215 and connected to the conductive material 241. The first electrode pad 240 may be electrically connected to the thin film 230 through the conductive material 241. The second via 219 and the third via 221 may be sequentially formed in the first substrate 215 and the support unit 220, respectively. The conductive material 241 may be filled inside of the second and third vias 219 and 221. The third via 221 may be connected to the second via 219, and a size of the third via 221 may be smaller than or the same as that of the second via 219. The first electrode pad 240 may be disposed in a lower surface of the conductive material 241, and extend to the lower surface of the first substrate 215. A second insulating layer 217 may be further disposed in inner walls of the second via 219 and the third via 221 and the lower surface of the first substrate 215 to insulate the first substrate 215 from the first electrode pad 240. The thin film 230 may include highly doped silicon, i.e. low resistance silicon, and may be used as an upper electrode. The thin film 230 may be electrically connected to the first electrode pad 240 through the conductive material 241 filled inside of the second via 219 and the third via 221.

A second electrode pad 245 may be disposed on the lower surface of the first substrate 215 and may be spaced apart from the first electrode pad 240. The second electrode pad 245 may be electrically connected to the first substrate 215 that may be used as a lower electrode. If the second insulating layer 217 is further formed on the lower surface of the first substrate 215, the second insulating layer 217 may be patterned 214 to expose the first substrate 215, and the second electrode pad 245 may be partially disposed on the exposed first substrate 215 and the patterns second insulating layer 217.

The first and second electrode pads 240 and 245 may be formed of a eutectic bonding metal, for example, Au, Cu, Sn, Ag, Al, Pt, Ti, Ni, Cr, or an alloy of these metals. The second insulating layer 217 may be formed of oxide or nitride, for example, silicon oxide or silicon nitride. The conductive material 241 filled inside of the second and third vias 219 and 221 may be formed of, for example, Au, Cu, Sn, Ag, Al, Pt, Ti, Ni, Cr, or an alloy of these metals. A seal line (not shown) may be further disposed in a boundary of the lower surface of the first substrate 215.

The second wafer 250 may be disposed in a lower portion of the first wafer 210. The second wafer 250 may be bonded onto the first wafer 210 by eutectic bonding. The second wafer 250 may include a second substrate 255 in which a plurality of through wafer vias are formed. For example, a first through wafer via 260 corresponding to the via forming unit 203 may be formed in the second substrate 255, and a second through wafer via 265 corresponding to the electro-acoustic transducer cells 201 may be formed in the second substrate 255. First and second conductive materials 270 and 275 may be filled inside of the first and second through wafer via 260 and 265. A third electrode pad 281 may be formed on a top surface of the second substrate 255 in which the first through wafer via 260 is formed and may contact the first conductive material 270. The third electrode pad 281 may be electrically connected to the first electrode pad 240 positioned on a top portion thereof. A fourth electrode pad 283 may be formed on a top surface of the second substrate 255 in which the second through wafer via 265 is formed and may contact the second conductive material 275. The fourth electrode pad 283 may be electrically connected to the second electrode pad 245 positioned on a top portion thereof.

A fifth electrode pad 285 may be formed on a lower surface of the second substrate 255 in which the first through wafer via 260 is formed and may contact the first conductive material 270. A sixth electrode pad 287 may be formed on a lower surface of the second substrate 255 in which the second through wafer via 265 is formed and may contact the second conductive material 275. The fifth and sixth electrode pads 285 and 287 may be electrically connected to a PCB or an ASIC (not shown) disposed in the lower portion of the second substrate 255.

The second substrate 255 may be formed of silicon, etc. That is, the second substrate 255 may be a silicon substrate and the first and second through wafer vias 260 and 265 may be TSVs. The third through sixth electrode pads 281, 283, 285, and 287 may be formed of eutectic bonding metals, for example, Au, Cu, Sn, Ag, Al, Pt, Ti, Ni, Cr, or an alloy of these metals. The first and second conductive materials 270 and 275 may include, for example, Au, Cu, Sn, Ag, Al, Pt, Ti, Ni, Cr, or an alloy of these metals.

The first and second wafers 210 and 250 may be mechanically and electrically connected by eutectic bonding. Eutectic bonding is a method of bonding metals by thermally compressing the metals to a eutectic temperature, hardening the metals below the eutectic temperature, and forming a bonding layer, which is one of several high strength and stable bonding methods. For example, the first electrode pad 240 may connected to the third electrode pad 281 by eutectic bonding, and the second electrode pad 245 may be connected to the fourth electrode pad 283 by eutectic bonding. The electro-acoustic transducer 200 may include the first and second wafers 210 and 250 that are bonded onto each other, and may electrically connect the first wafer 210 in which the electro-acoustic transducer cells 201 are formed to an external substrate through the second wafer 250. The second wafer 250 of the electro-acoustic transducer 200 may be used as a handle wafer. That is, the second wafer 250 of several hundreds of μm may be a support substrate to carry or process the electro-acoustic transducer cells 201 formed in the first wafer 210.

Since the second wafer 250 of the electro-acoustic transducer 200 includes silicon other than oxide, the first and second through wafer vias 260 and 265 may be easily formed. The first and second through wafer vias 260 and 265 may be formed irrespective of sizes thereof, and may be greater than those of the electro-acoustic transducer cells 201. The first wafer 210 is thinned and thus the second and third vias 219 and 221 may not have an HAR structure. Thus, the first electrode pad 240 may be easily formed in the second and third vias 219 and 221, thereby increasing a reliability of an electrical connection between the first electrode pad 240 and the second and third vias 219 and 221.

FIGS. 3A through 3J are schematic cross-sectional views for explaining a method of manufacturing the electro-acoustic transducer 100, according to an embodiment.

Figure 3A:
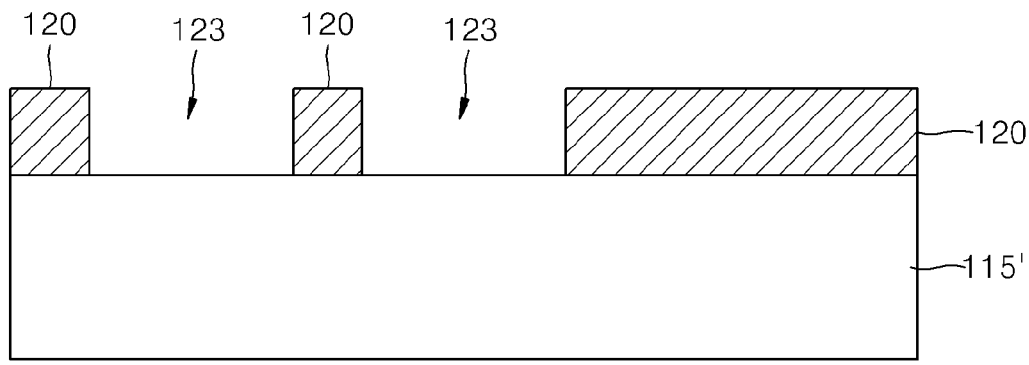
FIGS. 3A through 3J are schematic cross-sectional views for explaining a method of manufacturing an electro-acoustic transducer, according to an embodiment.

Referring to FIG. 3A, a first substrate 115' may be prepared, and the support unit 120 in which a plurality of through holes 123 are formed may be formed in a top surface of the first substrate 115'. The first substrate 115' may be formed of silicon. The first substrate 115' may be formed of highly doped silicon, i.e. low resistance silicon, and may be used as a lower electrode. The support unit 120 may be formed by patterning an insulator. The through holes 123 may be formed in an m×n 2D array in the support unit 120. At least one of the through holes 123 may be filled with the insulator, where m and n are natural numbers. The first substrate 115' may be exposed through bottom surfaces of the through holes 123. The support unit 120 may include oxide, nitride, etc. and more particularly silicon oxide. For example, the support 120 in which the through holes 123 are formed may be formed by forming a silicon oxide layer on the first substrate 115' and patterning the silicon oxide layer. The support unit 120 may be a side wall of an electro-acoustic transducer cell or may include a via.

Figure 3B:
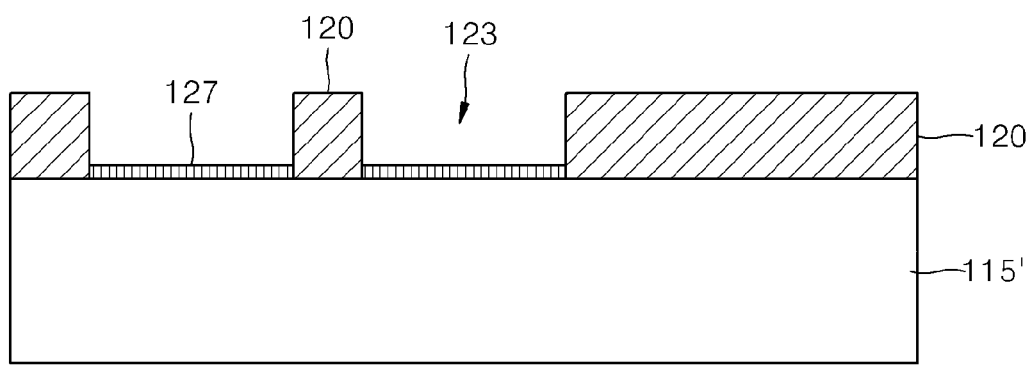

Referring to FIG. 3B, the first insulating layer 127 may be formed on the first substrate 115 that forms bottom surfaces of the through holes 123. The first insulating layer 127 may include oxide, nitride, etc. and more particularly silicon oxide. The first insulating layer 127 may prevent a short circuit between the first substrate 115' that is a lower electrode and the electrode layer (135 of FIG. 3J) that is an upper electrode.

Figure 3C:
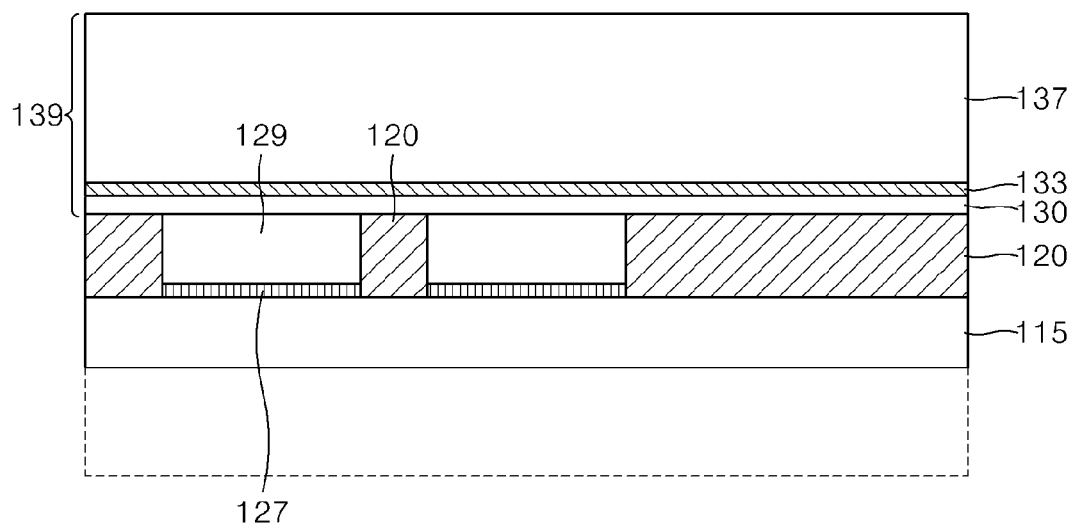

Referring to FIG. 3C, the thin film 130 may be formed on the support unit 120. A silicon on insulator (SOI) wafer 139 may be attached onto the support unit 120 in order to form the thin film 130. For example, the SOI wafer 139 may be bonded onto the support unit 120 by silicon direct bonding. The SOI wafer 139 may include a device wafer that is the thin film 130, an insulating layer 133, and a handle wafer 137. The insulating layer 133 may be formed of silicon oxide, and may be referred to as a buried oxide (BOX) layer. The handle wafer 137 may have a thickness of several hundreds of μm, and may be a support substrate to carry or process a device wafer or other devices attached onto the device wafer. The thin film 130 disposed on the support unit 120 may form the first substrate 115 and the cavity 129 with the support unit 120. The cavity 129 may be in a vacuum.

The first substrate 115' having the thickness of several hundreds of μm is thinned so that the first substrate 115 having a thickness of several tens of μm may be formed. The first substrate 115 may be thinned by using a grinding process or a chemical mechanical polishing (CMP) process. For example, the first substrate 115' having a thickness from about 100 μm to about 500 μm is thinned so that the first substrate 115 having a thickness from about 10 μm to about 50 μm may be formed.

Figure 3D:
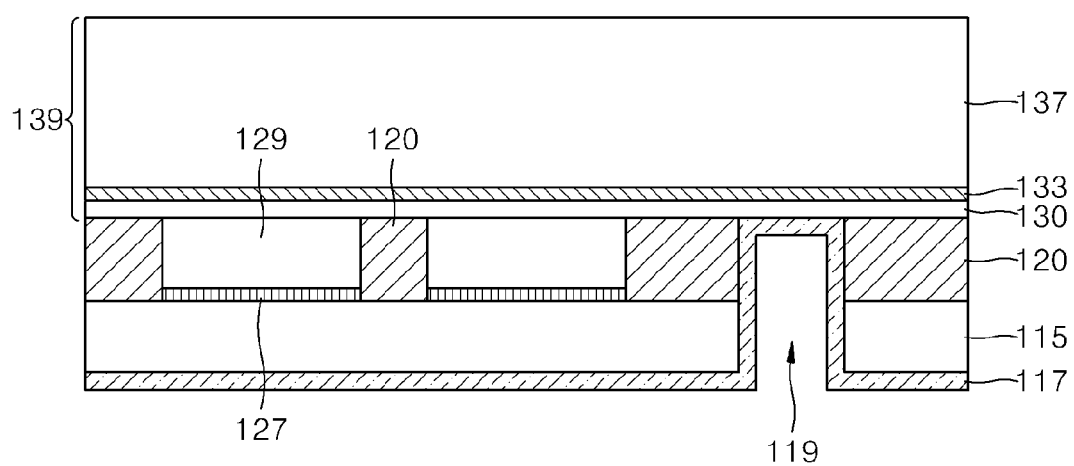

Referring to FIG. 3D, the first via 119 may be formed in the first substrate 115 and the support unit 120. The first via 119 may pass through the first substrate 115 and the support unit 120. The second insulating layer 117 may be formed in the inside wall of the first via 119 and the lower surface of the first substrate 115. The second insulating layer 117 may electrically insulate the first electrode pad (140 of FIG. 3E) from the first substrate 115. The second insulating layer 117 may include oxide or nitride, for example, silicon oxide or silicon nitride.

Figure 3E:
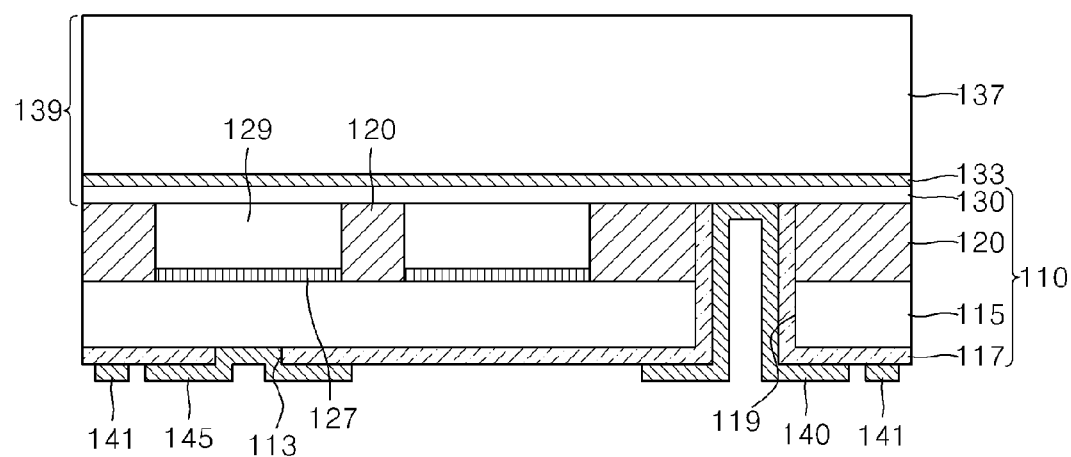

Referring to FIG. 3E, the thin film 130 may be exposed by patterning the second insulating layer 117 formed on a top portion of the first via 119. The first substrate 115 may be partially exposed by patterning 113 the second insulating layer 117 disposed in the lower surface of the first substrate 115. The first electrode pad 140 may be formed on the exposed thin film 130 and the second insulating layer 117 formed in the inner wall of the first via 119. The first electrode pad 140 may extend from the first via 119 to a part of the lower surface of the first substrate 115. The second electrode pad 145 may be formed on a part 113 of the exposed first substrate 115. The second electrode pad 145 may extend to the part of the lower surface of the first substrate 115, and may be spaced apart from the first electrode pad 140. The second electrode pad 145 may be electrically connected to the first substrate 115.

The first and second electrode pads 140 and 145 may be formed of a eutectic bonding metal, for example, Au, Cu, Sn, Ag, Al, Pt, Ti, Ni, Cr, or an alloy of these metals. A seal line 141 may be disposed in a boundary of the lower surface of the first substrate 115. The seal line 141 may surround the first and second electrode pads 140 and 145 to protect electrical connection units such as the first and second electrode pads 140 and 145 from an external environment. The seal line 141 may be formed of metal, for example, Au, Cu, Sn, Ag, Al, Pt, Ti, Ni, Cr, or an alloy of these metals.

Figure 3F:
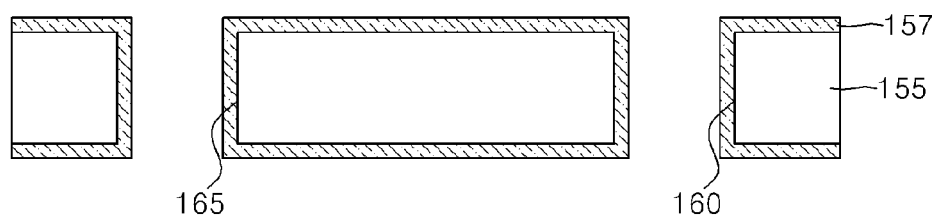

Referring to FIG. 3F, a plurality of through wafer vias may be formed in the second substrate 155. For example, the first and second through wafer vias 160 and 165 that are spaced apart from each other may be formed in the second substrate 155. The first through wafer via 160 may be formed in a region corresponding to the first electrode pad 140 of FIG. 3E, and the second through wafer via 165 may be formed in a region corresponding to the second electrode pad 145. The second substrate 155 may be a silicon substrate. The first and second through wafer vias 160 and 165 may be TSVs.

The third insulating layer 157 may be formed on the top and bottom surfaces of the second substrate 155 and in the inner walls of the first and second through wafer vias 160 and 165. The third insulating layer 157 may be formed of oxide or nitride, for example, silicon oxide or silicon nitride. For example, the third insulating layer 157 may be formed by depositing TEOS onto the second substrate 155 at a high temperature from about 400° C. to about 900° C.

Figure 3G:
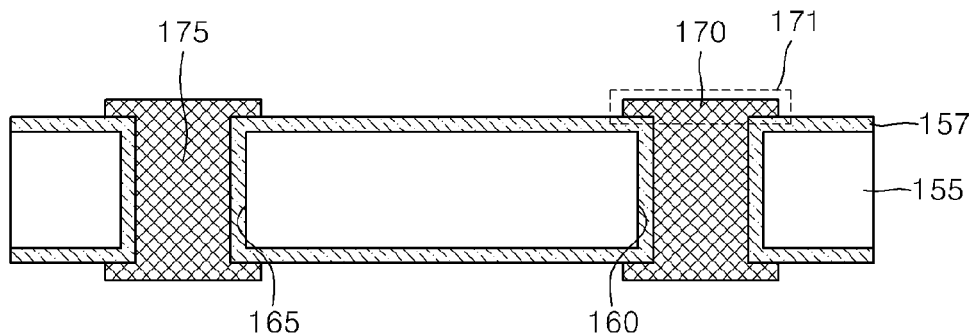

Referring to FIG. 3G, the first and second conducive materials 170 and 175 may be respectively filled in the first and second through wafer vias 160 and 165. The first and second conducive materials 170 and 175 may include Au, Cu, Sn, Ag, Al, Pt, Ti, Ni, Cr, or an alloy of these metals. For example, Cu may be filled in the first and second through wafer vias 160 and 165 by using electroplating process. A conductive material layer 171 formed exceeding the first and second through wafer vias 160 and 165 may be removed. Thus, the conductive material 170 may be filled inside of the first and second through wafer vias 160 and 165. For example, the conductive material layer 171 may be removed by using a CMP process by using the third insulating layer 157 as a stop layer.

Figure 3H:
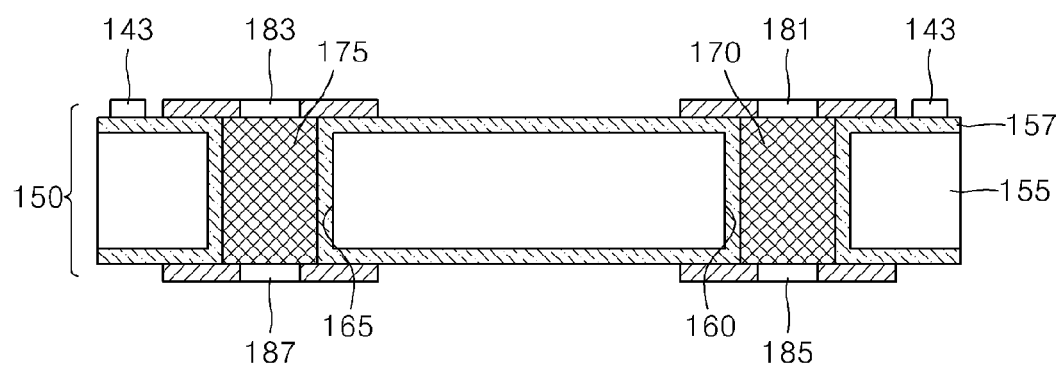

Referring to FIG. 3H, the third and fourth electrode pads 181 and 183 may be formed on the top surface of the second substrate 155. The third electrode pad 181 may be connected to the first conductive material 170 filled in the first through wafer via 160. The fourth electrode pad 183 may be spaced apart from the third electrode pad 181 and may be connected to the second conductive material 175 filled in the second through wafer via 165. The fifth and sixth electrode pads 185 and 187 may be further formed on the lower surface of the second substrate 155. The fifth and sixth electrode pads 185 and 187 may be respectively connected to the first and second conductive materials 170 and 175 filled in the first and second through wafer vias 160 and 165. The fifth and sixth electrode pads 185 and 187 may be electrically connected to a PCB or an ASIC (not shown) disposed in a lower portion of the second wafer 150.

A seal line 143 may be formed around a boundary of the top surface of the second substrate 155. The seal line 143 may surround the third and fourth electrode pads 181 and 183 to protect electrical connection units such as the third and fourth electrode pads 181 and 183 from an external environment. The seal lines 141 and 143 respectively formed on the first and second substrates 115 and 155 may be used to connect the first and second substrates 115 and 155 by eutectic bonding. Thus, the seal lines 141 and 143 may further strengthen coupling between the first and second substrates 115 and 155. The seal line 143 may be formed of a metal, for example, Au, Cu, Sn, Ag, Al, Pt, Ti, Ni, Cr, or an alloy of these metals.

Figure 3I:
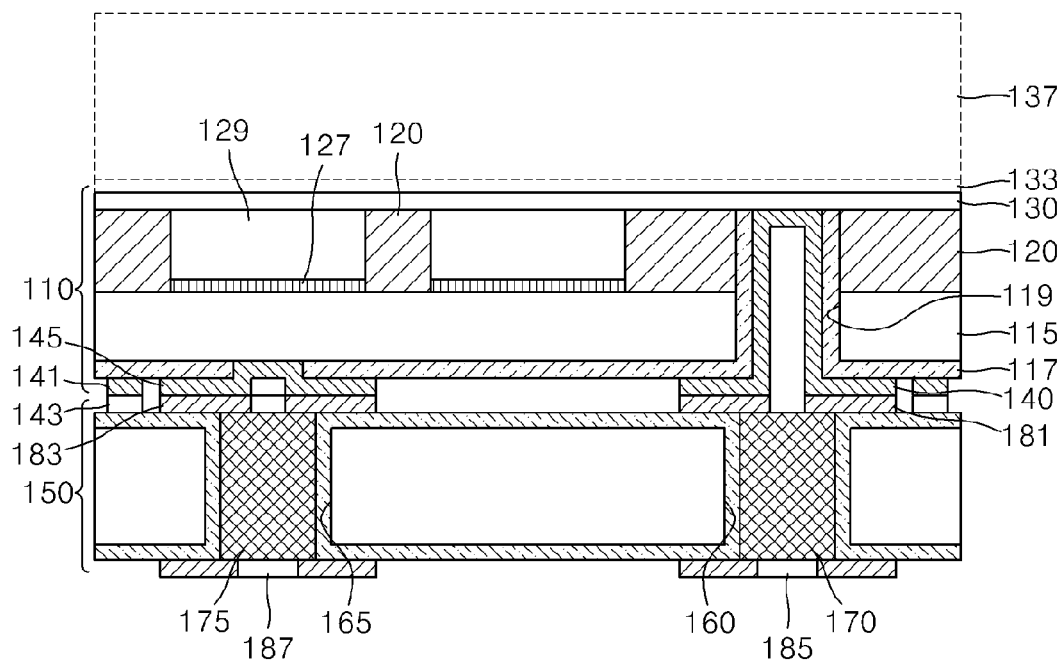

Referring to FIG. 3I, the first wafer 110 of FIG. 3E and the second wafer 150 of FIG. 3H may be bonded onto each other. The first and second wafers 110 and 150 may be mechanically and electrically connected by eutectic bonding. Eutectic bonding is a method of bonding metals by thermally compressing the metals to a eutectic temperature, hardening the metals below the eutectic temperature, and forming a bonding layer, which is one of several high strength and stable bonding methods. For example, the first electrode pad 140 may be connected to the third electrode pad 181 by eutectic bonding, and the second electrode pad 145 may be connected to the fourth electrode pad 183 by eutectic bonding. The seal lines 141 and 143 respectively formed on the bottom surface of the first wafer 110 and the top surface of the second wafer 150 may be connected to each other by eutectic bonding. The thin film 130 that is a device wafer may remain in the SOI wafer 139, and the insulating layer 133 and the handle wafer 137 may be removed. The second wafer 150 may be used as a handle wafer in a subsequent process. That is, the second wafer 150 of several hundreds of μm may be a support substrate to carry or process the electro-acoustic transducer cells formed in the first wafer 110.

Figure 3J:
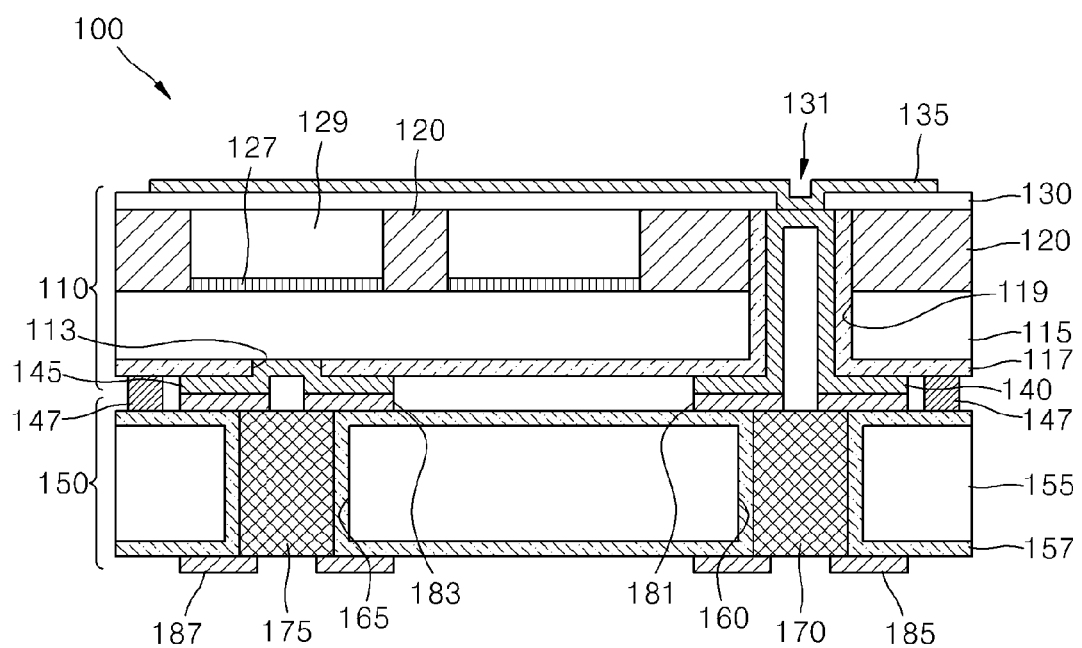

Referring to FIG. 3J, the fourth via 131 may be formed on the thin film 130 by using the second wafer 150 as the handle wafer. The fourth via 131 may be formed by using, for example, a reactive ion etching (RIE) process. The fourth via 131 may be used to expose the first electrode pad 140 disposed in the first via 119. The electrode layer 135 may be formed on the thin film 130. The electrode layer 135 may be electrically connected to the first electrode pad 140 through the fourth via 131. The electrode layer 135 may be formed of a conductive material, for example, Au, Cu, Sn, Ag, Al, Pt, Ti, Ni, Cr, or an alloy of these metals.

FIGS. 4A through 4H are schematic cross-sectional views for explaining a method of manufacturing the electro-acoustic transducer 200, according to another embodiment.

Figure 4A:
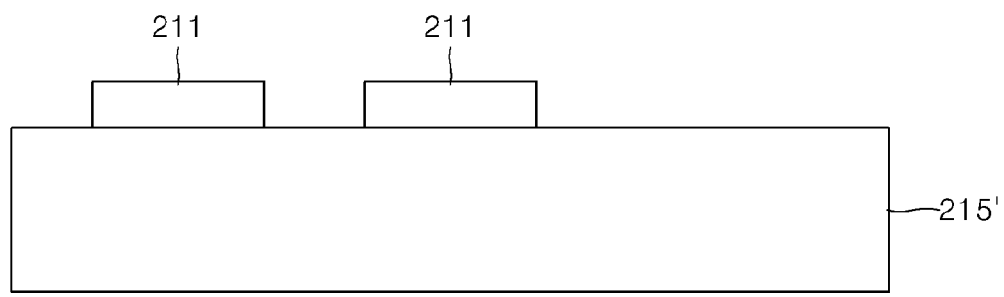
FIGS. 4A through 4H are schematic cross-sectional views for explaining a method of manufacturing an electro-acoustic transducer, according to another embodiment.
Figure 4B:
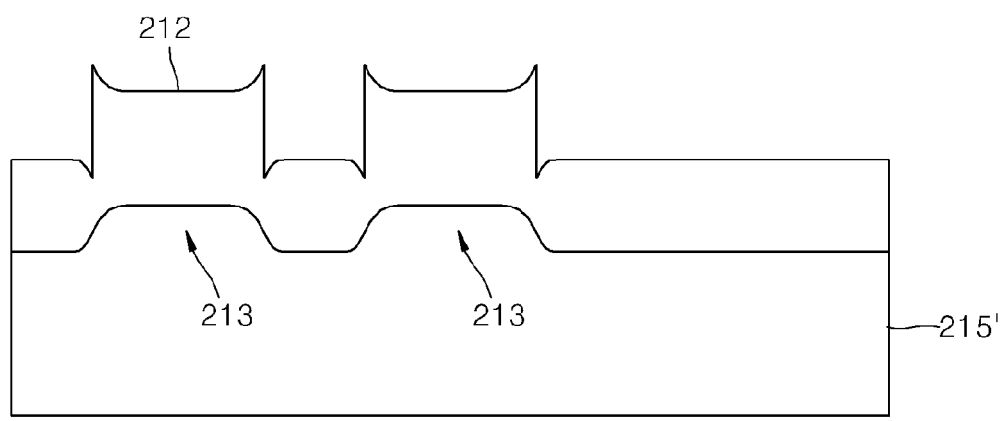

Referring to FIG. 4A, a first substrate 215' may be prepared, and a protrusion unit pattern 211 may be formed on the first substrate 215' to form a protrusion unit (213 of FIG. 4B). The first substrate 215' may be formed of silicon. The first substrate 215' may be formed of highly doped silicon, i.e. low resistance silicon, and may be used as a lower electrode. The protrusion unit pattern 211 may be formed by patterning an insulator. For example, the protrusion unit pattern 211 may be formed by oxidizing the first substrate 215', forming a silicon oxide layer on the first substrate 215', and patterning the silicon oxide layer.

Referring to FIG. 4B, the first substrate 215' in which the protrusion unit pattern 211 is formed may be oxidized again. The protrusion unit 213 may be formed on the top surface of the first substrate 215'. A silicon oxide layer 212 may be formed to cover the protrusion unit 213. A part of the silicon oxide layer 212 formed on the protrusion unit 213 may be greater than a part of the silicon oxide layer 212 not formed on the protrusion unit 213.

Figure 4C:
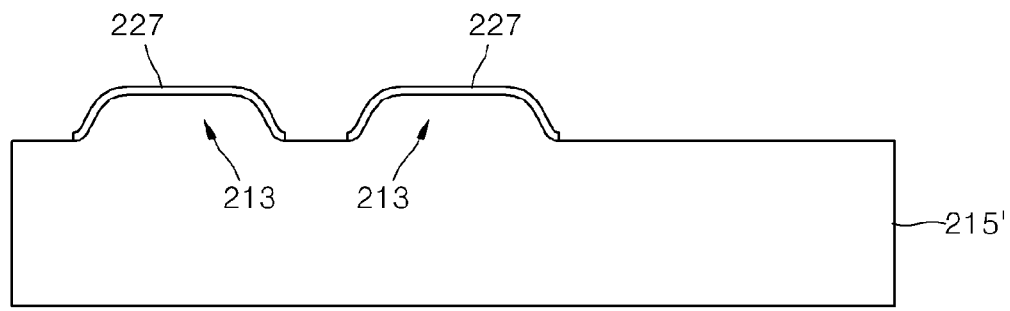

Referring to FIG. 4C, the silicon oxide layer (212 of FIG. 4B) formed on the first substrate 215' may be removed. The silicon oxide layer 212 may be removed, for example, by using an etching process. The protrusion unit 213 may be formed on the first substrate 215'. The first insulating layer 227 may be formed on the protrusion unit 213. The first insulating layer 227 may be formed to cover the protrusion unit 213. The first insulating layer 227 may be formed of oxide or nitride, for example, silicon nitride. The first insulating layer 227 may prevent a short circuit between the first substrate 215' that is a lower electrode and the thin film (230 of FIG. 4H) that is an upper electrode.

Figure 4D:
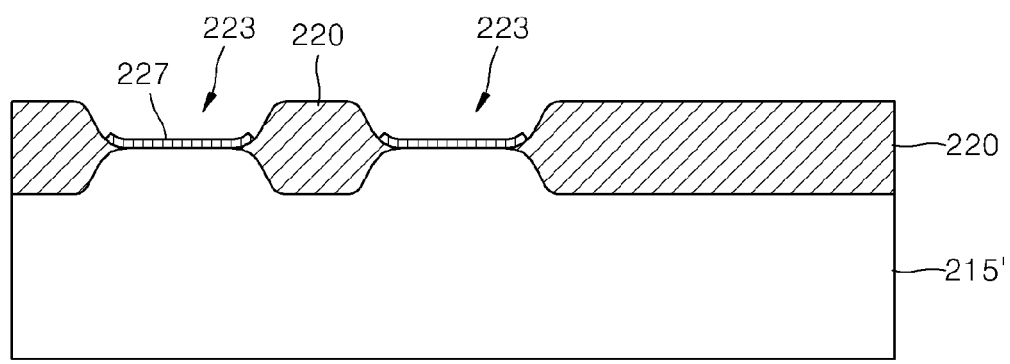

Referring to FIG. 4D, the support unit 220 may be formed on the first substrate 215'. The support unit 220 may be formed of an insulator. The support unit 220 may include, for example, oxide, nitride, etc., and more particularly, silicon oxide. For example, the support unit 220 may be formed by locally oxidizing the first substrate 215'. The support unit 220 may be formed from a part where the first insulating layer 227 is not formed by using an LOCOS process. The support unit 220 and the protrusion unit 213 may form a plurality of trenches 223. The trenches 223 may be formed in an m×n 2D array (m and n are natural numbers) on the first substrate 215'. At least one of the trenches 223 may be filled with the insulator.

Figure 4E:
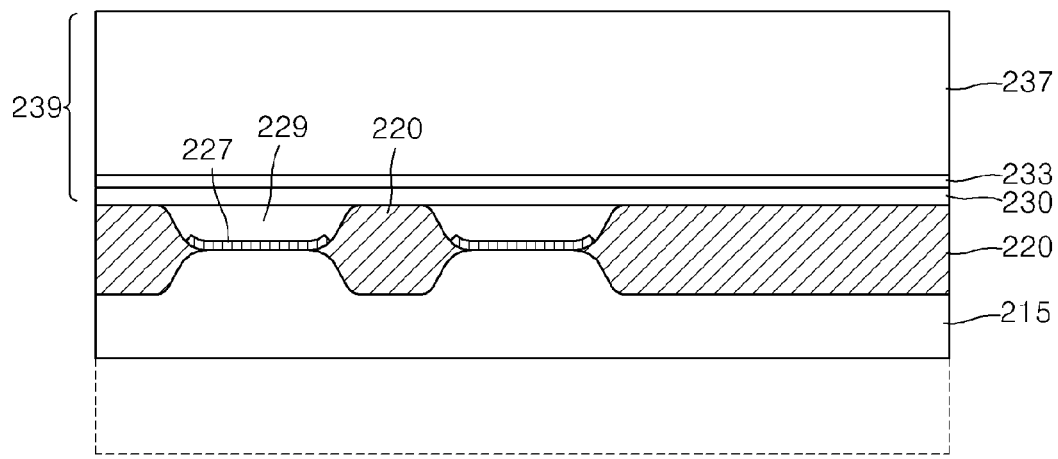

Referring to FIG. 4E, the thin film 230 may be formed on the support unit 220. A SOI wafer 239 may be attached onto the support unit 220 in order to form the thin film 230. For example, the SOI wafer 239 may be bonded onto the support unit 220 by silicon direct bonding. The SOI wafer 239 may include a device wafer, an insulating layer 233, and a handle wafer 237. The device wafer is the thin film 230. The insulating layer 233 may be formed of silicon oxide, and may be referred to as a BOX layer. The handle wafer 237 may have a thickness of several hundreds of μm, and may be a support substrate to carry or process the device wafer or other devices attached onto the device wafer. The trenches 223 of FIG. 4D may form the cavity 229 by sealing the first substrate 215, the support unit 220, and the thin film 230. The cavity 229 may be in a vacuum.

The first substrate 215' having the thickness of several hundreds of μm is thinned so that the first substrate 215 having a thickness of several tens μm may be formed. The first substrate 215 may be thinned by using a grinding process or a CMP process. For example, the first substrate 215' having a thickness from about 100 μm to about 500 μm is thinned so that the first substrate 215 having a thickness from about 10 μm to about 50 μm may be formed.

Figure 4F:
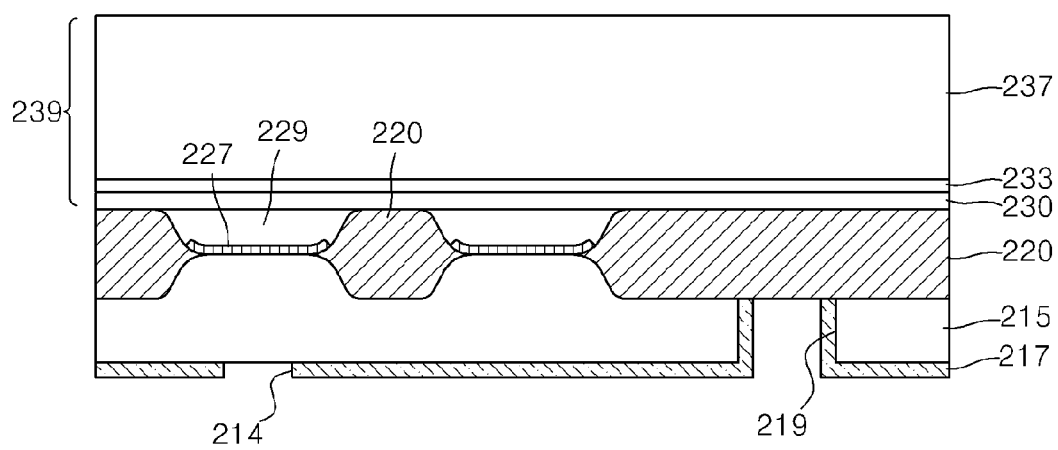

Referring to FIG. 4F, the second via 219 may be formed in the first substrate 215 under the support unit 220 in which the cavity 229 is not formed. The second via 219 may pass through the first substrate 215 to expose the support unit 220. The second insulating layer 217 may be formed on the lower surface of the first substrate 215. A part of the lower surface of the support unit 220 may be exposed through the second via 219 by patterning the top portion of the second insulating layer 217. The first substrate 215 may be partially exposed by patterning 214 the second insulating layer 217. The second insulating layer 217 may include oxide or nitride, for example, silicon oxide or silicon nitride.

Figure 4G:
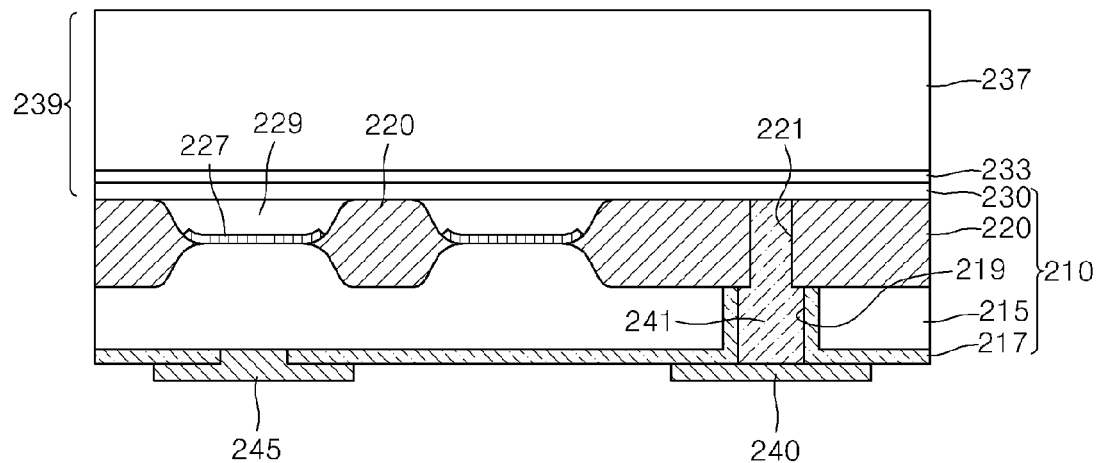

Referring to FIG. 4G, the third via 221 may be formed in the exposed support unit 220 and be connected to the second via 219. The third via 221 may pass through the support unit 220 to expose the thin film 230. A size of the third via 221 may be smaller than or the same as that of the second via 219. The second and third vias 210 and 221 may be filled with the conductive material 241. The conductive material 241 may include Au, Cu, Sn, Ag, Al, Pt, Ti, Ni, Cr, or an alloy of these metals.

The first electrode pad 240 may be formed on the lower surface of the conductive material 241 filled in the second and third vias 219 and 221. The first electrode pad 240 may extend to a part of the lower surface of the first substrate 215. The first electrode pad 240 may be electrically connected to the thin film 230 through the conductive material 241 filled in the second and third vias 219 and 221. Also, the second electrode pad 245 may be formed on the second insulating layer 217 that is patterned 214 to expose a part of the first substrate 215. The second electrode pad 245 may extend to a part of the second insulating layer 217 and may be spaced apart from the first electrode pad 240. The first and second electrode pads 240 and 245 may be formed of a eutectic bonding metal, for example, Au, Cu, Sn, Ag, Al, Pt, Ti, Ni, Cr, or an alloy of these metals. A seal line (not shown) may be further disposed in a boundary of the lower surface of the first substrate 215.

Figure 4H:
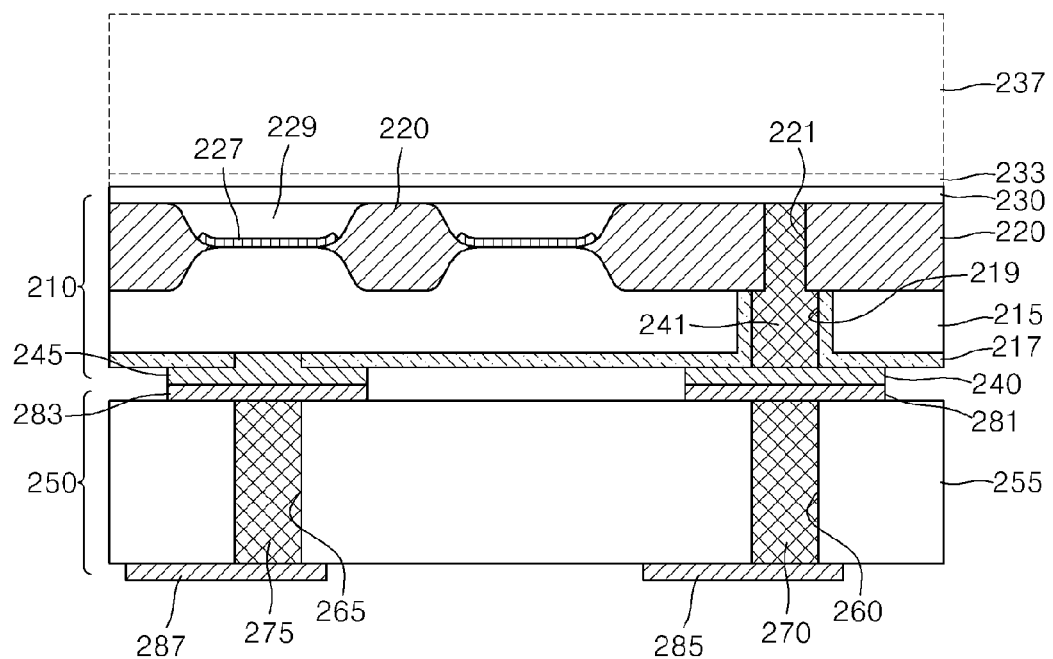

Referring to FIG. 4H, the second wafer 250 that is formed by the process of FIGS. 3F through 3H may be bonded onto the first wafer 210 of FIG. 4G. The second wafer 250 may include the second substrate 255 and a plurality of through wafer vias formed in the second substrate 255. For example, the second substrate 255 is a silicon substrate, and the through wafer vias may be TSVs. The through wafer vias may include the first and second through wafer vias 260 and 265. The first through wafer via 260 may be formed in a region corresponding to the first electrode pad 240 of FIG. 4G. The second through wafer via 265 may be formed in a region corresponding to the second electrode pad 245. The first and second through wafer vias 260 and 265 may be filled with the first and second conductive materials 270 and 275.

The third and fourth electrode pads 281 and 283 may be formed on the top surface of the second substrate 255. The third electrode pad 281 may be connected to the first conductive material 270 filled in the first through wafer via 260. The fourth electrode pad 283 may be spaced apart from the third electrode pad 281, and may be connected to the second conductive material 275 filled in the second through wafer via 265. The fifth and sixth pads 285 and 287 may be further formed on the top surface of the second substrate 255. The fifth and sixth pads 285 and 287 may be respectively connected to the first and second conductive materials 270 and 275 filled in the first and second through wafer vias 260 and 265. The fifth and sixth pads 285 and 287 may be rearranged not to be parallel to the third and fourth electrode pads 281 and 283. Thus, the fifth and sixth electrode pads 285 and 287 may be electrically connected to a PCB or an ASIC (not shown) disposed in the lower portion of the second substrate 255.

The thin film 130 that is a device wafer may remain in the SOI wafer 239, and the insulating layer 233 and the handle wafer 237 may be removed. The second wafer 250 may be used as a handle wafer in a subsequent process. That is, the second wafer 250 of several hundreds of μm may be a support substrate to carry or process the electro-acoustic transducer cells formed in the first wafer 210. The thin film 230 may include high density doped silicon, i.e. low resistance silicon, and may be used as an upper electrode.

The first and second wafers 210 and 250 may be electrically connected by eutectic bonding. For example, the first electrode pad 240 may be connected to the third electrode pad 281 by eutectic bonding, and the second electrode pad 245 may be connected to the fourth electrode pad 283 by eutectic bonding.

While an ultrasonic transducer and a method of manufacturing the ultrasonic transducer, according to the inventive concept have been particularly shown and described with reference to exemplary embodiments thereof, it will be understood by those of ordinary skill in the art that various changes in form and details may be made therein without departing from the spirit and scope of the inventive concept as defined by the following claims.

What is claimed is:
1. An electro-acoustic transducer comprising:
 a first wafer comprising a first substrate, an electrode layer spaced apart from the first substrate, a support unit disposed between the first substrate and the electrode layer, and a plurality of cavities sealed by the first substrate, the electrode layer and the support unit;
 a second wafer disposed on a lower portion of the first wafer, the second wafer comprising a second substrate in which a plurality of through wafer vias comprising a first through wafer via and a second through wafer via are formed,
 wherein the electrode layer is electrically connected to a third substrate through the first through wafer via and the first substrate is electrically connected to the third substrate through the second through wafer via.

2. The electro-acoustic transducer of claim 1, wherein the first and second wafers are bonded to each other by eutectic bonding.

3. The electro-acoustic transducer of claim 1, wherein the first wafer further comprises:
 a plurality of first insulating layers disposed on the first substrate in the plurality of cavities.

4. The electro-acoustic transducer of claim 1, wherein the first wafer further comprises:
 a thin film disposed on the support unit.

5. The electro-acoustic transducer of claim 1, further comprising a first via passing through the first substrate and the support unit.

6. The electro-acoustic transducer of claim 5, wherein the first via comprises:
 a second via formed passing through the first substrate positioned in a lower portion of the support unit; and
 a third via formed passing through the support unit and connected to the second via.

7. The electro-acoustic transducer of claim 5, further comprising:
 a first electrode pad disposed in the first via and on a lower surface of the first substrate; and
 a second electrode pad disposed on the lower surface of the first substrate and spaced apart from the first electrode pad.

8. The electro-acoustic transducer of claim 7, further comprising a second insulating layer disposed on an inner wall of the first via and the lower surface of the first substrate, the second insulating layer insulating the first substrate from the first electrode pad.

9. The electro-acoustic transducer of claim 4, wherein the electrode layer is electrically connected to a first electrode pad disposed in a first via formed passing through the first substrate and the support unit through a fourth via formed in the thin film.

10. The electro-acoustic transducer of claim 7, wherein:
 the first through wafer via is filled with a first conductive material electrically connected to the first electrode pad; and
 the second through wafer via is filled with a second conductive material electrically connected to the second electrode pad.

11. The electro-acoustic transducer of claim 10, further comprising a plurality of electrode pads disposed on top and bottom surfaces of the first and second through wafer vias.

12. The electro-acoustic transducer of claim 11, wherein the plurality of electrode pads comprise:
 a third electrode pad disposed on a top surface of the second substrate and electrically connected to the first conductive material filled in the first through wafer via; and
 a fourth electrode pad disposed on the top surface of the second substrate and electrically connected to the second conductive material filled in the second through wafer via.

13. The electro-acoustic transducer of claim 12, wherein the first electrode pad is connected to the third electrode pad by eutectic bonding and the second electrode pad is connected to the fourth electrode pad by eutectic bonding.

* * * * *